United States Patent
Oya et al.

(10) Patent No.: US 11,266,025 B2
(45) Date of Patent: Mar. 1, 2022

(54) ELECTRONIC-COMPONENT MANUFACTURING METHOD AND ELECTRONIC COMPONENTS

(71) Applicant: Qualtec Co., Ltd., Osaka-fu (JP)

(72) Inventors: Satoshi Oya, Sakai (JP); Seiichi Kaihara, Sakai (JP); Hiroshi Atarashi, Sakai (JP); Hirokazu Shikata, Sakai (JP)

(73) Assignee: Qualtec Co., Ltd., Osaka-fu (JP)

( * ) Notice: Subject to any disclaimer, the term of this patent is extended or adjusted under 35 U.S.C. 154(b) by 0 days.

(21) Appl. No.: 16/626,574

(22) PCT Filed: Sep. 19, 2018

(86) PCT No.: PCT/JP2018/034567
§ 371 (c)(1),
(2) Date: Dec. 26, 2019

(87) PCT Pub. No.: WO2019/102701
PCT Pub. Date: May 31, 2019

(65) Prior Publication Data
US 2020/0288577 A1    Sep. 10, 2020

(30) Foreign Application Priority Data
Nov. 21, 2017 (JP) .............................. JP2017-223999

(51) Int. Cl.
*H05K 3/18* (2006.01)
*C25D 5/56* (2006.01)
(Continued)

(52) U.S. Cl.
CPC .......... *H05K 3/188* (2013.01); *C23C 18/1605* (2013.01); *C23C 18/30* (2013.01); *C25D 5/56* (2013.01); *H05K 3/107* (2013.01)

(58) Field of Classification Search
USPC ............................................ 427/58, 553–555
See application file for complete search history.

(56) References Cited

U.S. PATENT DOCUMENTS 5,200,047 A * 4/1993 Hashimoto ......... C23C 18/1617
                                                     204/194
5,244,538 A * 9/1993 Kumar .................... H05K 3/045
                                                     216/18
(Continued)

FOREIGN PATENT DOCUMENTS

JP    H07-116870 A    5/1995
JP    2005-209817 A    8/2005
(Continued)

OTHER PUBLICATIONS

Qualtec Co., Ltd., "Micromachining Techniques Using Femtosecond Lasers," 27th Meeting of Electrotest Japan, Qualtec Technology Seminar: "High-Density Surface-Mounting Technology and Its Reliability & Evaluation Techniques Directed to Super-safe & Ecological Corporations," Jan. 20, 2010, Corporate in-house seminar, published online at: www.qualtec.co.jp/seminar/pdf/electrotest_2010_3.pdf.
(Continued)

*Primary Examiner* — Brian K Talbot
(74) *Attorney, Agent, or Firm* — J-Pat U.S. Patent Legal Services; James Judge

(57) ABSTRACT

Provided are an electronic component manufacturing method by which even a platable layer made of a difficult-to-plate material can be easily plated with good adhesion without using a special chemical solution or a photolithography technique, and an electronic component which has a peel strength of 0.1 N/mm or greater as measured by a copper foil peel test. A picosecond laser beam having a pulse duration on the order of a picosecond or a femtosecond laser beam having a pulse duration on the order of a femtosecond
(Continued)

is emitted at a surface of a platable layer (2) in order to roughen the surface, a wiring pattern is formed using a mask (13), and a plated part (12) is formed on the surface of the wiring pattern.

7 Claims, 14 Drawing Sheets

(51) Int. Cl.
*H05K 3/10* (2006.01)
*C23C 18/30* (2006.01)
*C23C 18/16* (2006.01)

(56) References Cited

U.S. PATENT DOCUMENTS

| | | | | |
|---|---|---|---|---|
| 5,369,881 | A * | 12/1994 | Inaba | H05K 3/045 |
| | | | | 174/259 |
| 6,967,152 | B1 * | 11/2005 | Jordan | H05K 3/107 |
| | | | | 438/597 |
| 9,491,866 | B2 * | 11/2016 | Lee | H05K 3/0026 |
| 2002/0102745 | A1 * | 8/2002 | Lahiri | H05K 3/185 |
| | | | | 438/4 |
| 2006/0240338 | A1 * | 10/2006 | Satoh | H01L 21/76838 |
| | | | | 430/5 |
| 2009/0277801 | A1 * | 11/2009 | Mayer | C25F 5/00 |
| | | | | 205/640 |
| 2013/0309522 | A1 * | 11/2013 | Ito | C23C 14/022 |
| | | | | 428/596 |
| 2015/0072070 | A1 * | 3/2015 | Saijo | C23C 18/1653 |
| | | | | 427/98.6 |
| 2016/0186323 | A1 * | 6/2016 | Iwashita | C23C 18/204 |
| | | | | 428/195.1 |
| 2017/0191165 | A1 * | 7/2017 | Nishimura | C23C 18/1868 |

FOREIGN PATENT DOCUMENTS

| | | |
|---|---|---|
| JP | 2008-041938 A | 2/2008 |
| JP | 2009-290082 A | 12/2009 |
| JP | 2015-010268 A | 1/2015 |
| JP | 2017-166003 A | 9/2017 |
| WO | WO2016/152938 A1 | 9/2016 |

OTHER PUBLICATIONS

Hiroharu Kamiyama, "Process for Manufacturing Printed Wiring Boards," Journal of the Surface Finishing Society of Japan, 1993, pp. 566-572, vol. 44, No. 7, The Surface Finishing Society of Japan, Tokyo.

* cited by examiner

*Prior Art*

ELECTRONIC-COMPONENT MANUFACTURING METHOD AND ELECTRONIC COMPONENTS

BACKGROUND

Technical Field

The present invention relates to electronic-component manufacturing methods and electronic components wherein metallization is formed onto to-be-metallized layers.

Background Art

Printed wiring boards are an instance in which, being laminated onto a baseplate made of, e.g., glass, a metal film is formed over the entire surface of the front side, and then by photolithographic techniques, the metal film is patterned to furnish metallic interconnects. In Patent Document 1, the forming by photolithography of metallic interconnects that are electrically conductive on both the front and back sides, or on one side, of a substrate containing a polymeric resin is disclosed.

PRECEDENT TECHNICAL LITERATURE

Patent Documents

Patent Document 1: Pat. Pub. Gazette No. 2009-2990082

SUMMARY OF INVENTION

Issues Invention is to Address

The above-mentioned photolithography requiring photoresist application, exposure, development, etching, and associated operations, with the operations being numerous is complex.

An object of the present invention, brought about taking such circumstances into consideration, is to make available an electronic-component manufacturing method that enables, without employing any special chemical solution or photolithographic technique, carrying out plating whose adhesion is favorable easily even on to-be-metallized layers composed of a difficult-to-metallize material, and to make available electronic components having a peel strength of 0.1 N/mm when subjected to a copper-foil peel test.

Means for Addressing the Issues

An electronic-component manufacturing method involving the present invention is characterized in that a picosecond laser beam in which the pulse-width units are picoseconds, or a femtosecond laser beam in which they are femtoseconds, is shone on the surface of a to-be-metallized layer to roughen the surface, wherein a mask is utilized to form an interconnect pattern, and metallization is formed on the interconnect-patterned surface.

Advantageous Effects of Invention

The pulse width of a picosecond laser beam or a femtosecond laser beam is extraordinarily short, allowing processing work wherein a to-be-metallized layer is heated to a temperature at which its melting point is exceeded before it heat-diffuses, whereby vaporization occurs, such that thermal impact is slight, and forming minute and sharp, multi-angled pyramidal roughness in the surface. Thanks to a mechanical interlocking effect, the adhesion of the metallization to the layer being metallized is ideal. That is, even in cases where the layer being metallized does not readily admit of chemical bonding between itself and the metallization, or is composed of a difficult-to-metallize material that does not readily admit of the roughing of its surface, favorable adhesion can be obtained.

MODES FOR EMBODYING TECHNOLOGY IN DISCLOSURE

Figure 1:
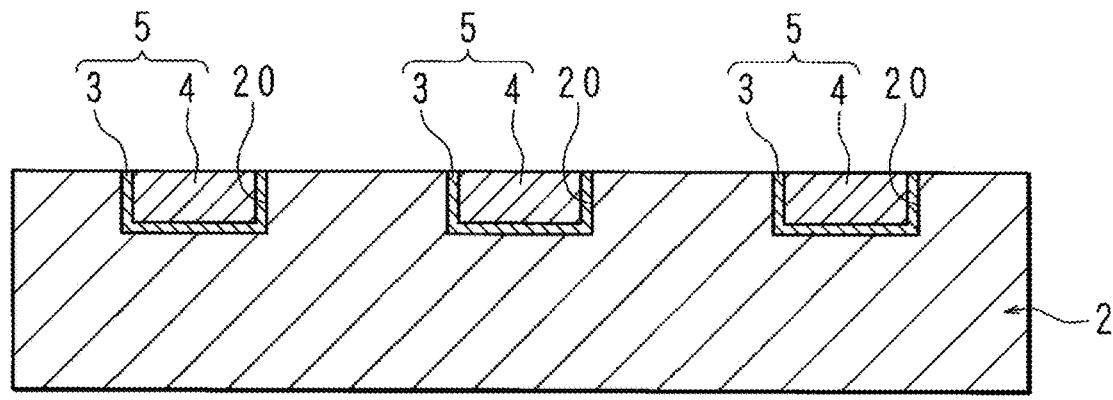
FIG. 1 is a schematic sectional view representing a wiring arrangement on an electronic component involving Embodying Mode 1.

In the following, a specific explanation of the present invention will be made, based on drawings illustrating modes of embodying the invention.

Outline of Embodying Modes

In modes of embodying electronic-component manufacturing methods, a picosecond laser beam in which the pulse-width units are picoseconds, or a femtosecond laser beam in which they are femtoseconds, is shone on the surface of a to-be-metallized layer to roughen the surface, and metallization is formed onto the roughened surface.

As stated above, plating is carried out with the surface having been roughened by a picosecond laser beam or a femtosecond laser beam. A picosecond laser beam or a femtosecond laser beam—whose pulse width, being on the order of picoseconds or the order of femtoseconds, is extremely short—heats the to-be-metallized layer to a temperature at which its melting point is exceeded before it heat-diffuses, whereby vaporization occurs. The areas that the laser beam irradiates are ablated and thus removed. Processing work whose thermal impact is slight is afforded, whereby roughness of minute and sharp, multi-angled pyramidal form is created in the surface of the to-be-metallized layer. The consequent mechanical interlocking effect leads to advantageous adhesion of the metallization to the layer being metallized. Even in cases where the layer being metallized does not readily admit of chemical bonding between itself and the metallization, or is composed of a difficult-to-metallize material that does not readily admit of the roughing of its surface, favorable adhesion can be obtained.

With an electronic-component manufacturing method involving the present invention, a picosecond laser beam in which the pulse-width units are picoseconds, or a femtosecond laser beam in which they are femtoseconds, is shone on the surface of a to-be-metallized layer to roughen the surface, wherein a mask is utilized to form an interconnect pattern, and metallization is formed in the interconnect-patterned surface.

The above-noted configuration affords processing work whose thermal impact is slight, whereby roughness of minute and sharp, multi-angled pyramidal form is created in the surface of the to-be-metallized layer. Thanks to the mechanical interlocking effect, adhesion of the metallization to the layer being metallized is ideal. Even in cases where the layer being metallized does not readily admit of chemical bonding between itself and the metallization, or is composed of a difficult-to-metallize material that does not readily admit of the roughing of its surface, favorable adhesion can be obtained.

Then, in a state in which the areas not interconnect-patterned are protected by the mask, the interconnect pattern is formed. The precision with which the interconnects are patterned is ideal. Compared with the situation where photolithographic procedures that are complex and whose operational steps are numerous are utilized to provide the interconnects, the operational steps are few, and provision of the interconnects is facilitated.

In the above-described electronic-component manufacturing method, the surface may be provided with the mask prior to the roughening of the surface, and it then may be irradiated with the picosecond laser beam or the femtosecond laser beam to roughen the surface while removing the mask to create the interconnect pattern.

The above-noted configuration makes it possible to remove the mask when the surface is roughened, wherein the interconnect pattern is readily created in the state in which the areas not interconnect-patterned are protected by the mask.

In the above-described electronic-component manufacturing method, a catalyst may be applied to the surface that has been roughened and the surface of mask that remains, and the catalyst activated, and the mask may be peeled off and an electroless copper plating solution utilized to create copper metallization on the interconnect-patterned surface.

According to the above-noted configuration, since the copper metallization is carried out with the catalyst being left remnant on the roughened areas alone, copper metallization of desired thickness can be created at one time.

In the above-described electronic-component manufacturing method, electroless copper plating may be carried out on the surface of the roughened-surface-containing layer being metallized to create first copper metallization; a mask may be provided on the surface of the first copper metallization and the mask perforated to create an interconnect pattern; electrolytic copper plating may be carried out in the perforated areas to create second copper metallization; and the mask may be peeled off, and the exposed first copper metallization removed by etching.

According to the above-noted configuration, since the first copper metallization is formed on the entire surface of the to-be-metallized layer, with no providing of a power-feed plane, electrolytic copper plating can be carried out to form the second copper metallization.

The electrolytic copper plating makes it possible to thicken the thickness of the metallization, and makes it possible to cause the metallization to protrude from the surface of the layer being metallized in a rectangular or trapezoidal form in plan view. It is preferable that the electroless Cu plating preferably be autocatalytic plating.

In the above-described electronic-component manufacturing method, the surface of the layer being metallized may be irradiated with the picosecond laser beam or the femtosecond laser beam to perforate the mask.

The above-noted configuration enables efficiently utilizing the picosecond laser beam or the femtosecond laser beam employed in surface roughening to perforate the mask.

In the above-described electronic-component manufacturing method, the mask may contain an acrylic polymer of the alkaline-soluble type.

In copper plating instances, while there are several operations that employ acidic or neutral solutions, according to the above-noted configuration, with no subtracting of the mask due to it reacting in those operations, the mask is removed solely in a mask removal operation utilizing an alkaline solution.

In the above-described electronic-component manufacturing method, the femtosecond laser beam may be rendered with a femtosecond green laser utilized to lase.

Because femtosecond green lasers are second-harmonic, relatively high output power can be extracted, and even with to-be-metallized layers that are synthetic resin or similarly made, absorption into the to-be-metallized layers is favorable.

The wavelength of the beam that the femtosecond green laser emits preferably is 500 nm to 530 nm. The pulse width preferably is from 1 femtosecond to 1000 femtoseconds.

Likewise, when a picosecond laser is utilized, the wavelength of the beam that the picosecond laser emits preferably is 500 nm to 530 nm. The pulse width preferably is 1 picosecond to 10 picoseconds.

In the above-described electronic-component manufacturing method, the to-be metallized layer may contain a material selected from the group consisting of acrylic resins, PET, PTFE, glass, epoxy resins, liquid-crystal polymers, and polyimide resins.

According to an electronic-component manufacturing method of the present embodying mode, metallization can be provided with ideal adhesion even on to-be metallized layers of difficult-metallizabilty materials such as acrylic resins, PET, PTFE, thin-glass sheets or similar glass, epoxy resins, liquid crystal polymers, and polyimide resins.

Herein, the fact that metallization can be provided with favorable adhesion onto a to-be-metallized layer of a difficult-to-metallize material means that metallization can be provided with good adhesion onto, as the to-be-metallized layer, phenolic paper baseplates, epoxy-and-paper baseplates, glass composite baseplates, glass-and-epoxy baseplates, ceramic baseplates, and the like, which are conventional baseplate materials.

In the above-described electronic-component manufacturing method, it is preferable that the metallization layer be copper metallization, and the peel strength when a copper-foil peel test in which the metallization is peeled from the layer being metallized is carried out be not less than 0.1 N/mm.

In accordance with the above-noted configuration, the adhesion of the electronic component's metallization to its layer being metallized is ideal.

The peel strength in acrylic resin instances is in order of further preferability not less than 0.2 N/mm, and not less than 0.3 N/mm. In PET instances, that it be not less than 0.2 N/mm is further preferable. In thin-glass sheet instances, that it be not less than 0.3 N/mm is further preferable. In PTFE, epoxy resin, and liquid-crystal polymer instances, the peel strength is in order of further preferability not less than 0.7 N/mm, and not less than 0.8 N/mm.

In the above-described electronic-component manufacturing method, the surface of the to-be-metallized layer may be roughened so that the arithmetic mean roughness Ra of the to-be-metallized layer is not less than 0.2 µm.

According to the above-noted configuration, the adhesion of the metallization to the to-be-metallized layer is ideal. The arithmetic mean roughness Ra is in order of further preferability not less than 0.3 µm, not less than 0.4 µm, and not less than 0.5 µm.

As to an electronic component of the present embodying mode, in an electronic component in which copper metallization is provided on the surface of a to-be-metallized layer containing a material selected from the group consisting of acrylic resins, PET, PTFE, glass, epoxy resins, liquid-crystal polymers, and polyimide resins, the surface of the to-be-metallized layer is roughened by a picosecond laser beam in which the pulse-width units are picoseconds, or a femtosecond laser beam in which they are femtoseconds, wherein the peel strength when a copper-foil peel test in which the copper metallization is peeled from the layer being metallized is carried out is not less than 0.1 N/mm.

In accordance with the above-noted configuration, the adhesion of the electronic component's copper metallization to its layer being metallized is ideal.

The peel strength in acrylic resin instances is in order of further preferability not less than 0.2 N/mm, and not less than 0.3 N/mm. In PET instances, that it be not less than 0.2 N/mm is further preferable. In thin-glass sheet instances, that it be not less than 0.3 N/mm is further preferable. In PTFE, epoxy resin, and liquid-crystal polymer instances, the peel strength is in order of further preferability not less than 0.7 N/mm, and not less than 0.8 N/mm.

As to an electronic component of the present embodying mode, in an electronic component in which copper metallization is provided on the surface of a to-be-metallized layer containing a material selected from the group consisting of acrylic resins, PET, PTFE, glass, epoxy resins, liquid-crystal polymers, and polyimide resins, the surface of the to-be-metallized layer is roughened by a picosecond laser beam in which the pulse-width units are picoseconds, or a femtosecond laser beam in which they are femtoseconds, wherein the arithmetic mean roughness Ra of the to-be-metallized layer is not less than 0.2 µm.

According to the above-noted configuration, the adhesion of the copper metallization to the to-be-metallized layer is ideal. The arithmetic mean roughness Ra is in order of further preferability not less than 0.3 µm, not less than 0.4 µm, and not less than 0.5 µm.

In the following a description will be specifically made based on the drawings.

Embodying Mode 1

FIG. 1 is a schematic sectional view representing a wiring arrangement on an electronic component involving Embodying Mode 1.

The electronic component 1 has a base layer 2 in the surface of which a plurality of recesses 20 is provided. On the surface of each recess 20, an interconnect 5 composed of Cu is provided. The interconnect 5 includes first Cu metallization 3 provided on the bottom and side surfaces of the recess 20, and second Cu metallization 4 provided on the surface of the first Cu metallization 3 so as to fill the recess 20. The first Cu metallization 3 and the second Cu metallization 4 are made unitary.

In the following, a method of manufacturing the electronic component 1 will be described.

Figure 2:
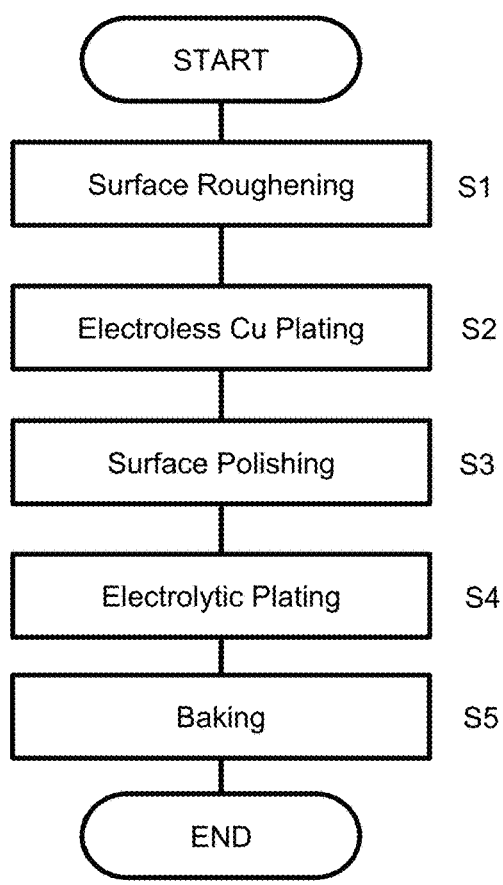
FIG. 2 is a flowchart representing a metallization process.

FIG. 2 is a flowchart representing a metallization process, and FIGS. 3A to 3E are schematic sectional views for explaining the electronic component's manufacture.

Figure 3A:
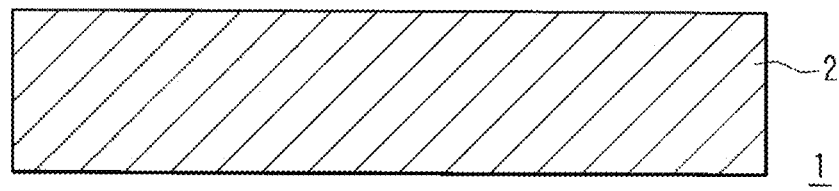
FIG. 3A is a schematic sectional view for explaining the manufacture of an electronic component.

The base layer 2 is composed of a material such as an acrylic resin, PET, PTFE, a thin-glass sheet or similar glass, an epoxy resin, a liquid-crystal polymer, or a polyimide resin (FIG. 3A).

Figure 3B:
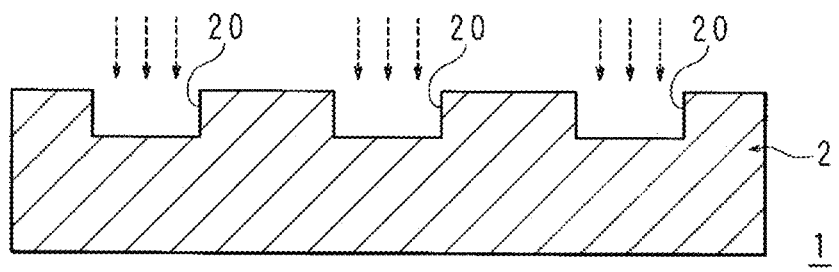
FIG. 3B is a schematic sectional view for explaining the manufacture of an electronic component.

To begin with, the surface of the base layer 2 is roughened (S1, FIG. 3B). A femtosecond laser beam or a picosecond laser beam is directed onto the surface of the base layer 2 to remove areas thereon that correspond to the interconnect pattern and create square-trenchlike recesses 20, and to roughen the bottom and side surfaces of the recesses 20.

Figure 3C:
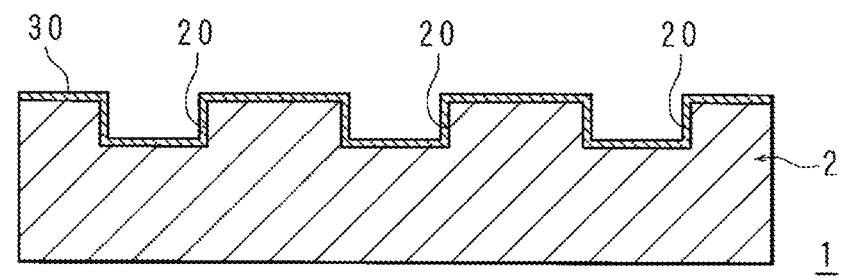
FIG. 3C is a schematic sectional view for explaining the manufacture of an electronic component.

Next, electroless Cu plating is carried out to form a metallizing film 30 on the surface of the base layer 2 (S2, FIG. 3C). As the electroless Cu plating solution, an electroless Cu plating solution of the reduction-deposition type in the strong alkali region, with formalin being the reducing agent, can be utilized. As a chelating agent, EDTA or Rochelle salt can be utilized. Prior to the plating, Pd that serves as a catalyst is applied so that the reducing agent within the electroless Cu plating solution gives off electrons along the base layer 2. Cu ions within the electroless Cu plating solution are reduced by electrons given off by the oxidation reaction of the reducing agent, and by being deposited on the surface of the base layer 2, form the metallizing film 30.

Figure 3D:
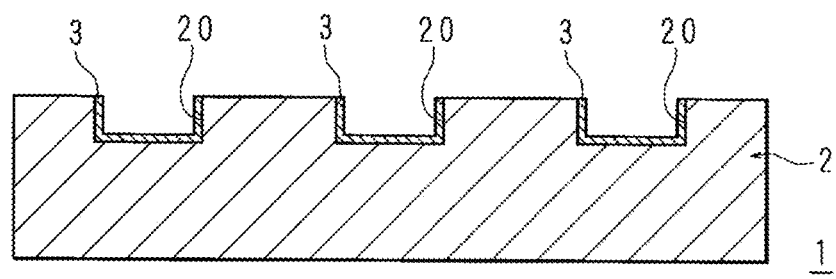
FIG. 3D is a schematic sectional view for explaining the manufacture of an electronic component.

Surface polishing is carried out to remove the metallizing film 30 where it is formed on the non-roughened areas (S3, FIG. 3D). The first Cu metallization 3 remains on the bottom and side surfaces of the recesses 20.

Figure 3E:
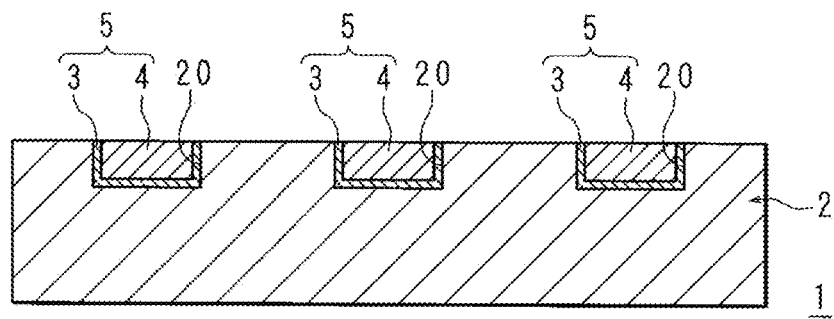
FIG. 3E is a schematic sectional view for explaining the manufacture of an electronic component.

Electrolytic Cu plating is carried out to form the second Cu metallization 4 onto the first Cu metallization 3 (S4, FIG. 3E). An example of the electrolytic Cu-plating solution composition and plating conditions is presented in the listing below.

Electrolytic Cu-Plating Solution Composition
  Copper sulfate pentahydrate: 100 g/L
  Sulfuric acid: 190 g/L
  Chlorine: 50 mg/L
  Brightening agent: suitable amount
Electrolytic Cu Plating Conditions
  Solution temperature: Room temperature
  Current density: 2 A/dm$^2$ The interconnects 5 are formed as given above. The interconnects 5 may be provided so as to protrude from the surface of the base layer 2 in a rectangular form or a trapezoidal form when viewed sideways. Electrolytic Cu plating can be omitted depending on the situation.

Lastly, baking is carried out at 80 to 200° C. for 30 minutes to 1 hour, for example (S5). It will be appreciated that baking can be omitted when the base layer 2 is composed of PET.

Figure 4A:
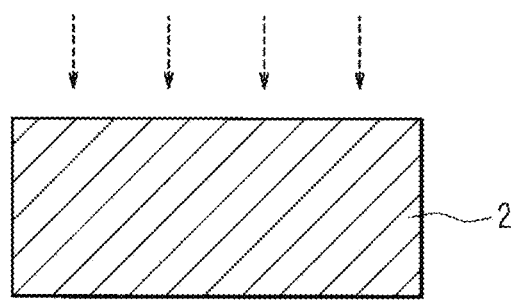
FIG. 4A is a schematic sectional view for explaining a metallized section in Embodying Mode 1.
Figure 4B:
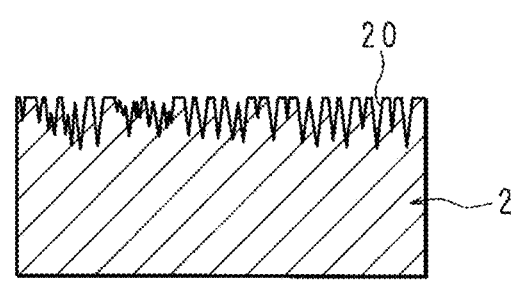
FIG. 4B is a schematic sectional view for explaining a metallized section in Embodying Mode 1.
Figure 4C:
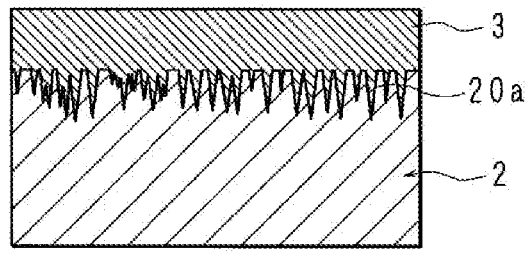
FIG. 4C is a schematic sectional view for explaining a metallized section in Embodying Mode 1.

FIGS. 4A to 4C are schematic sectional views for explaining a metallized section in the present embodying mode. The base layer 2 is irradiated with a femtosecond laser beam (FIG. 4A) to form notches 20 in the base layer 2 (FIG. 4B). The notches 20 have minute multi-angled pyramidal roughness 20a in the surface.

First Cu metallization 3 is formed on the notches 20 (FIG. 4C). Owing to the mechanical interlocking effect, the adhesion improves remarkably.

Figure 5A:
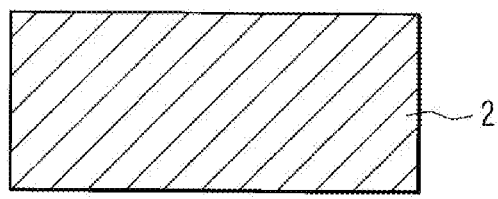
FIG. 5A is a schematic sectional view representing a conventional metallized section.
Figure 5B:
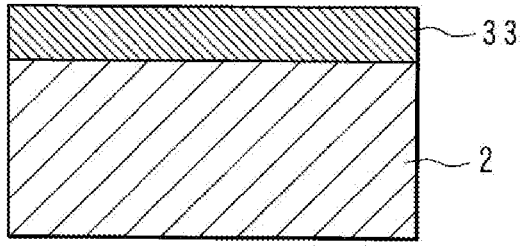
FIG. 5B is a schematic sectional view representing a conventional metallized section.
Figure 5C:
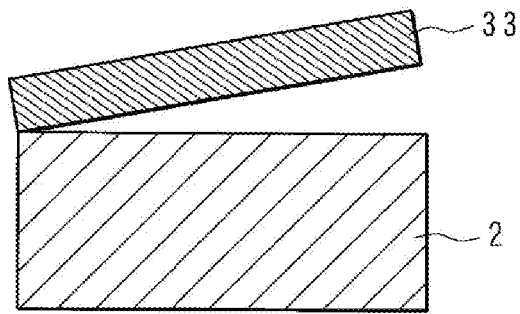
FIG. 5C is a schematic sectional view representing a conventional metallized section.

FIGS. 5A to 5C are schematic sectional views representing a conventional metallized section. On a base layer 2 (FIG. 5A), special chemical solutions are used to provide a Cu metallization layer 33 (FIG. 5B).

As indicated in FIGS. 5A to 5C, the inter-base layer 2-Cu metallization layer 33 chemical bonding is inadequate, and since roughness in the surface of the base layer 2 is lacking, the adhesion is poor, such that the Cu metallization layer 33 peels off easily.

According to the present embodying mode, onto a base layer 2 composed of a difficult-to-metallize material, plating having favorable adhesion can be easily carried out, with no employing of any special chemical solution or photolithographic technique.

Embodying Mode 2

Figure 6:
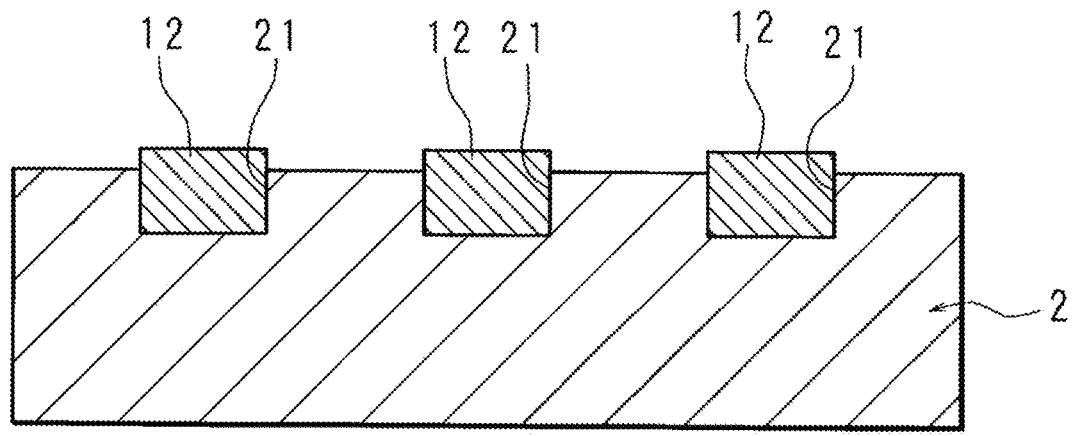
FIG. 6 is a schematic sectional view representing a wiring arrangement on an electronic component involving Embodying Mode 2.

FIG. 6 is a schematic sectional view representing a wiring arrangement on an electronic component 11 involving Embodying Mode 2.

The electronic component 11 has a base layer 2 in the surface of which a plurality of recesses 21 is provided. An interconnect 12 composed of Cu is provided on the surface of each recess 21.

In the following, a method of manufacturing the electronic component 11 will be described.

Figure 7:
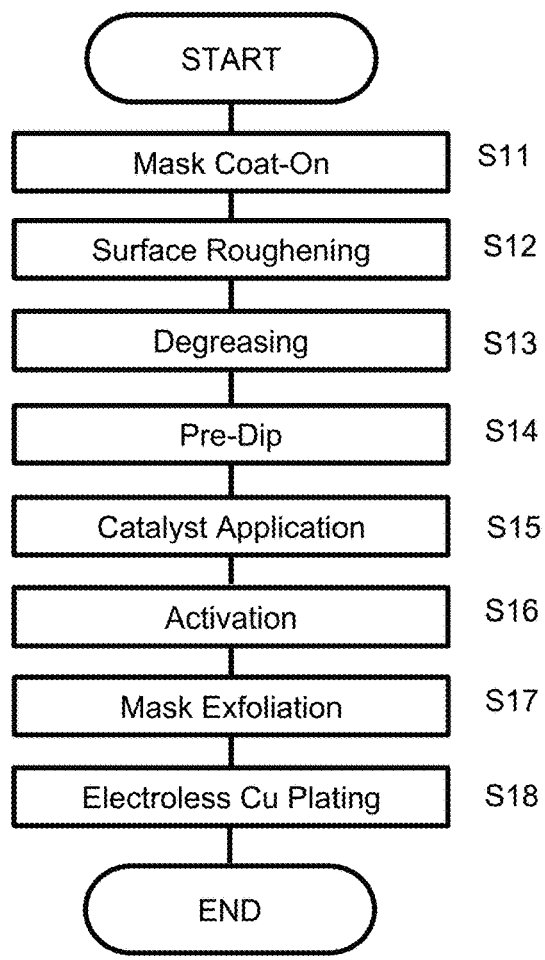
FIG. 7 is a flowchart representing a metallization process.

FIG. 7 is a flowchart representing a metallization process, and FIGS. 8A to 8F are schematic sectional views for explaining the method of manufacturing the electronic component 11.

Figure 8A:
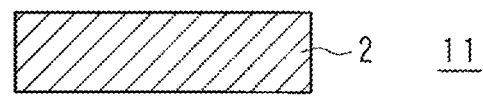
FIG. 8A is a schematic sectional view for explaining an electronic-component manufacturing method.

The base layer 2 is composed of a material such as an acrylic resin, PET, PTFE, a thin-glass sheet or similar glass, an epoxy resin, a liquid-crystal polymer, or a polyimide resin (FIG. 8A).

Figure 8B:
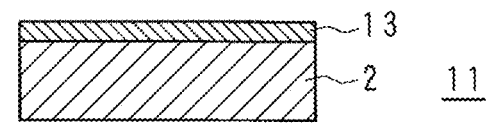
FIG. 8B is a schematic sectional view for explaining the electronic-component manufacturing method.

To begin with, a mask 13 is coated onto the surface of the base layer 2 (S11, FIG. 8B). For the mask, it is preferable that it contain an acrylic polymer of the alkaline-soluble type.

Figure 8C:
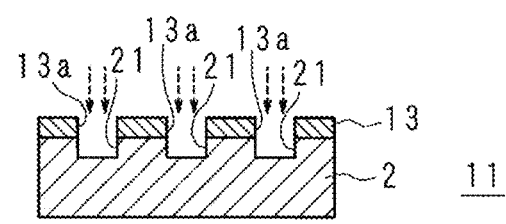
FIG. 8C is a schematic sectional view for explaining the electronic-component manufacturing method.

The surface of the base layer 2 is roughened (S12, FIG. 8C). A femtosecond laser beam or a picosecond laser beam is directed onto the surface of the base layer 2 to remove areas thereon that correspond to the interconnect pattern and create square-trenchlike recesses 21, and to roughen the bottom and side surfaces of the recesses 21. In this situation, the areas of the mask 13 that correspond to the areas where interconnects 12 are formed are removed, forming holes 13a. The patterning of the interconnects may be carried out based on marks formed on the surface of the mask 13, or may be carried out based on crosshairs or the like formed onto the base layer 2.

Degreasing is carried out on the base layer 2 using an acidic degreaser under conditions of, for example, 45° C. for 5 minutes (S13).

A pre-dip process is carried out using a hydrochloric acid aqueous solution (S14). The hold time is, for example, 2 minutes.

Figure 8D:
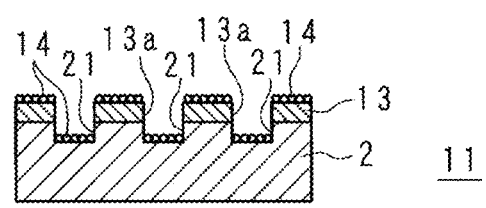
FIG. 8D is a schematic sectional view for explaining the electronic-component manufacturing method.

Next, an SnPd catalyst 14 is applied to the surface of the recesses 21 and the surface of the mask 13 remaining areas (S15, FIG. 8D). The SnPd catalyst 14 is colloidal particles, wherein an Sn-rich layer and an Sn' layer form in that order on the surface of the PdSn cores.

Activation is carried out (S16). The base layer 2 to which the SnPd catalyst 14 has been applied is immersed in a hydrochloric acid solution, whereby the Sn layer is removed, exposing the internal Pd catalyst. The exposure of the Pd catalyst gives rise to reactions due to electroless Cu-plating solution, which will be described later, in the areas where the SnPd catalyst 14 is present.

Figure 8E:
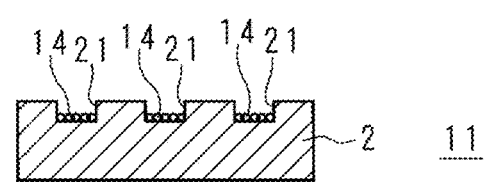
FIG. 8E is a schematic sectional view for explaining the electronic-component manufacturing method.

An alkaline solution is employed to exfoliate the mask 13 (S17, FIG. 8E). The Sn Pd catalyst 14 will not be present in the areas on the base layer 2 from which the mask 13 has been peeled off.

Figure 8F:
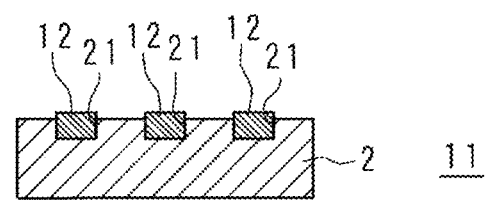
FIG. 8F is a schematic sectional view for explaining the electronic-component manufacturing method.

Electroless Cu plating is then carried out to form the interconnects 12 on the surface of the base layer 2 (S18, FIG. 8F). As the electroless Cu plating solution, an above-described electroless Cu plating solution of the reduction-deposition type in the strong alkali region, with formalin being the reducing agent, can be utilized. As a chelating agent, EDTA or Rochelle salt can be utilized. The Pd, which functions as a catalyst, is applied so that the reducing agent within the electroless Cu plating solution will give off electrons along the base layer 2. Accordingly, Cu ions within the electroless Cu plating solution are reduced by electrons given off by the oxidation reaction of the reducing agent, and by being deposited on the surface of the base layer 2, form the interconnects 12.

According to the present embodying mode, onto a base layer 2 composed of a difficult-to-metallize material, plating having favorable adhesion can be easily carried out, with no employing of any special chemical solution or photolithographic technique.

In Embodying Mode 1, a metallizing film 30 having the same thickness on the roughened areas and the non-roughened areas has been formed, after which surface polishing is carried out to remove the metallizing film 30 on the non-roughened areas and leave first Cu metallization 3 on the bottom surface and side surfaces of the recesses 20, and second Cu metallization 4 formed onto the first Cu metallization 3, to control the thickness of the interconnects 5.

In the present embodying mode, since the mask 13 is utilized to carry out plating to leave SnPd catalyst 14 only on the roughened areas of the base layer 2 corresponding to the interconnects 12, the interconnect 12 patterning precision is excellent, and surface polishing is unnecessary. In a state in which the areas apart from the areas corresponding to the interconnect pattern is protected by the mask 13, the interconnect pattern forms readily. Since electroless Cu plating is carried out only on the roughened areas, interconnects (Cu metallization) 12 of desired thickness can be formed, eliminating the necessity of carrying out Cu plating in two stages as in Embodying Mode 1.

Embodying Mode 3

Figure 9:
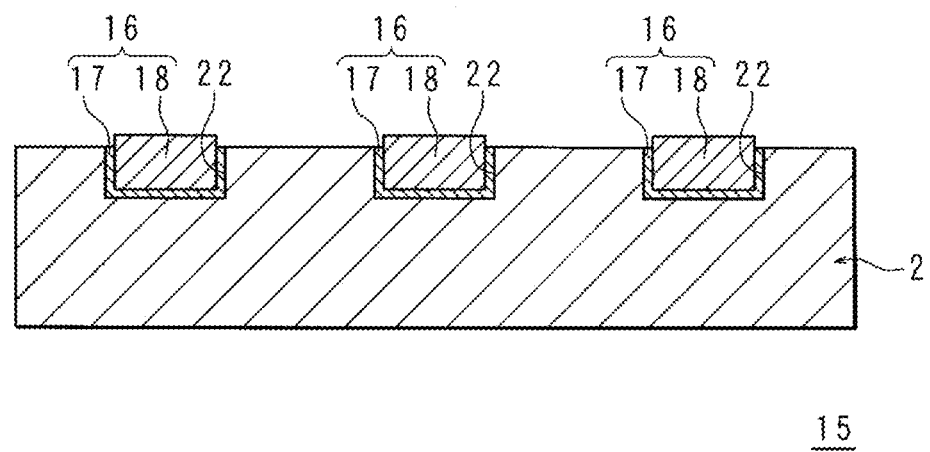
FIG. 9 is a schematic sectional view representing a wiring arrangement on an electronic component involving Embodying Mode 3.

FIG. 9 is a schematic sectional view representing a wiring arrangement on an electronic component 15 involving Embodying Mode 3.

The electronic component 15 has a base layer 2 in the surface of which a plurality of recesses 22 is provided. On the surface of each recess 22, an interconnect 16 composed of Cu is provided. The interconnect 16 includes first Cu metallization 17 provided on the bottom and side surfaces of the recess 22, and second Cu metallization 18 provided on the surface of the first Cu metallization 17 so as to fill the recess 22. The second Cu metallization 18 protrudes from the surface of the base layer 2 in a rectangular form or a trapezoidal form when viewed sideways. The first Cu metallization 17 and the second Cu metallization 18 are made unitary.

In the following, a method of manufacturing the electronic component 15 will be described.

Figure 10:
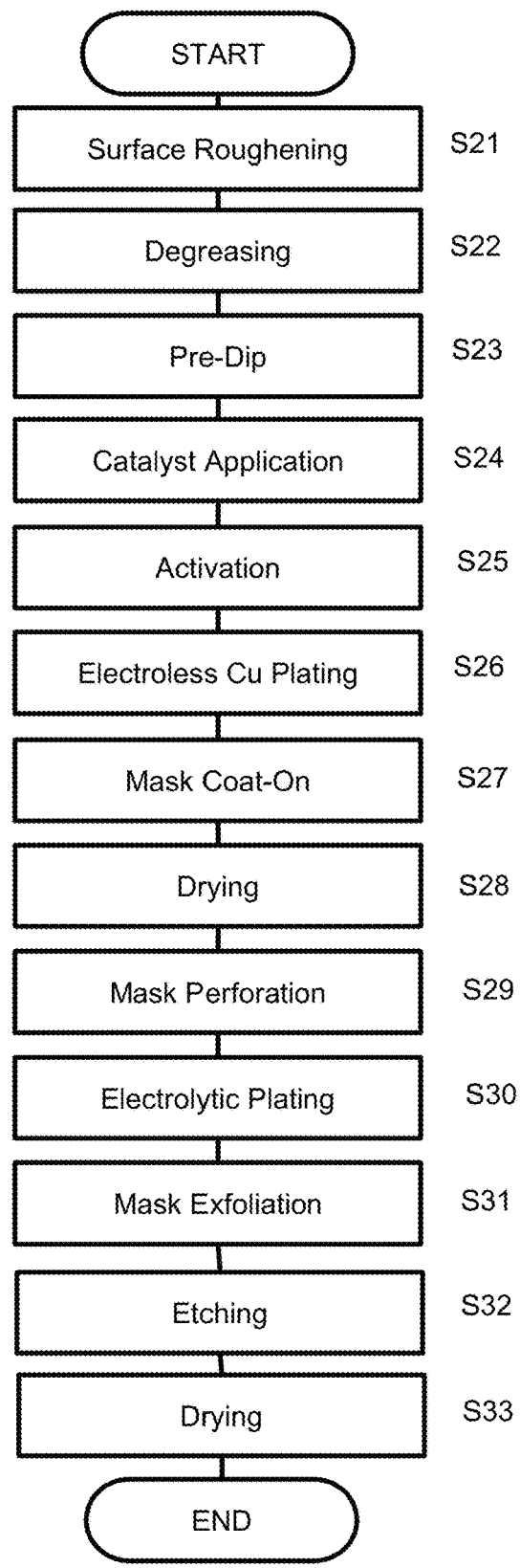
FIG. 10 is a flowchart representing a metallization process.

FIG. 10 is a flowchart representing a metallization process, and FIGS. 11A to 11H are schematic sectional views for explaining the method of manufacturing the electronic component 15.

Figure 11A:
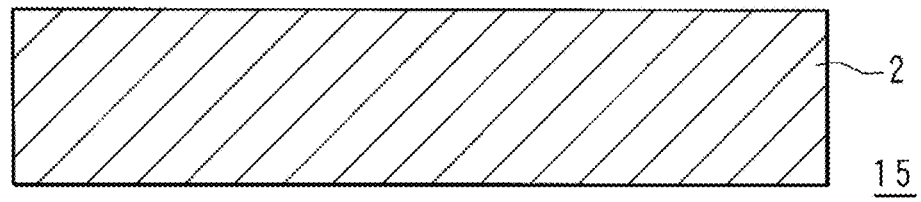
FIG. 11A is a schematic sectional view for explaining an electronic-component manufacturing method.

The base layer 2 is composed of a material such as an acrylic resin, PET, PTFE, a thin-glass sheet or similar glass, an epoxy resin, a liquid-crystal polymer, or a polyimide resin (FIG. 11A).

Figure 11B:
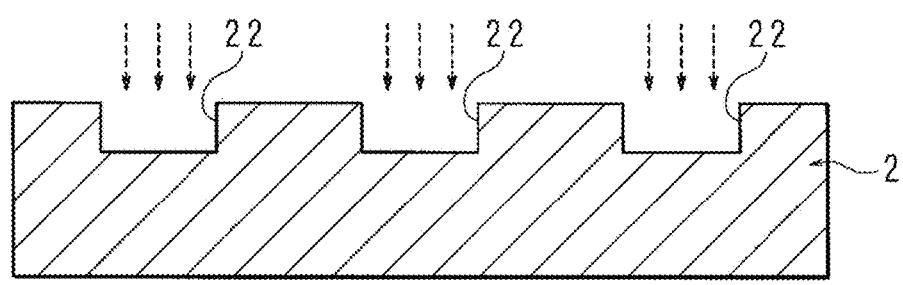
FIG. 11B is a schematic sectional view for explaining the electronic-component manufacturing method.

The surface of the base layer 2 is roughened (S21, FIG. 11B). A femtosecond laser beam or a picosecond laser beam is directed onto the surface of the base layer 2 to remove areas thereon that correspond to the interconnect pattern and create square-trenchlike recesses 22, and to roughen the bottom and side surfaces of the recesses 22.

Degreasing is carried out on the base layer 2 using an acidic degreaser under conditions of, for example, 45° C. for 5 minutes (S22).

A pre-dip process is carried out using a hydrochloric acid aqueous solution (S23). The hold time is, for example, 2 minutes.

An SnPd catalyst is applied to the surface of the base layer 2 (S24). The SnPd catalyst is colloidal particles, wherein an Sn-rich layer and an Sn' layer form in that order on the surface of the PdSn cores.

Activation is carried out (S25). The base layer 2 to which the SnPd catalyst 14 has been applied is immersed in a hydrochloric acid solution, whereby the Sn layer is removed, exposing the internal Pd catalyst.

Figure 11C:
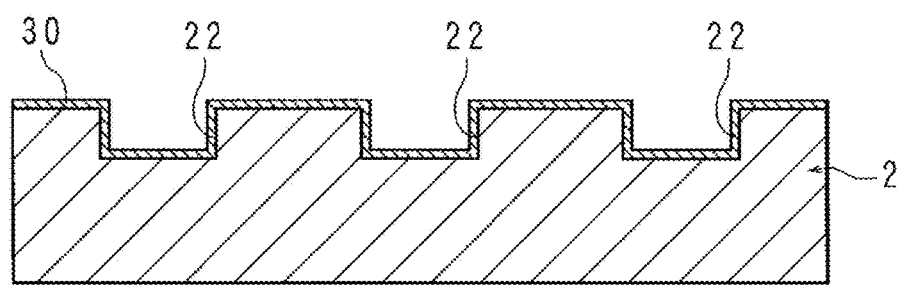
FIG. 11C is a schematic sectional view for explaining the electronic-component manufacturing method.

Electroless Cu plating is carried out to form a metallizing film 30 on the surface of the base layer 2 (S26, FIG. 11C). As the electroless Cu plating solution, an above-described electroless Cu plating solution of the reduction-deposition type in the strong alkali region, with formalin being the reducing agent, can be utilized. As a chelating agent, EDTA or Rochelle salt can be utilized. The Cu ions within the electroless Cu plating solution are reduced by electrons given off by the oxidation reaction of the reducing agent, and by being deposited on the surface of the base layer 2, form the metallizing film 30.

Figure 11D:
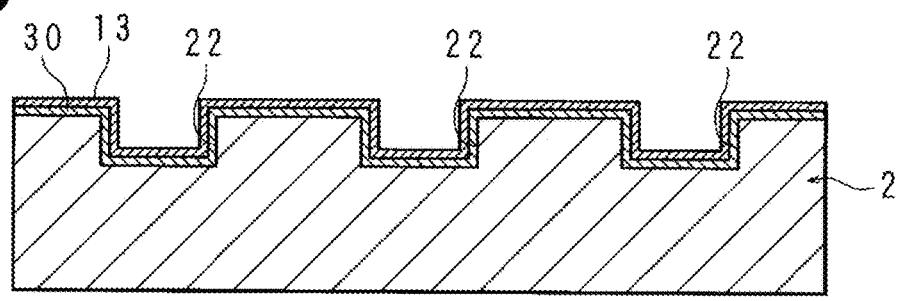
FIG. 11D is a schematic sectional view for explaining the electronic-component manufacturing method.

A mask 13 is coated onto the surface of the base layer 2 (S27, FIG. 11D). For the mask material, it is preferable that it contain an acrylic polymer of the alkaline-soluble type. The mask material may include colorants, dyes, or pigments. The laser workability is thereby improved.

The surface is dried (S28). Drying is carried out at a temperature of 20° C. to 80° C., for example.

Figure 11E:
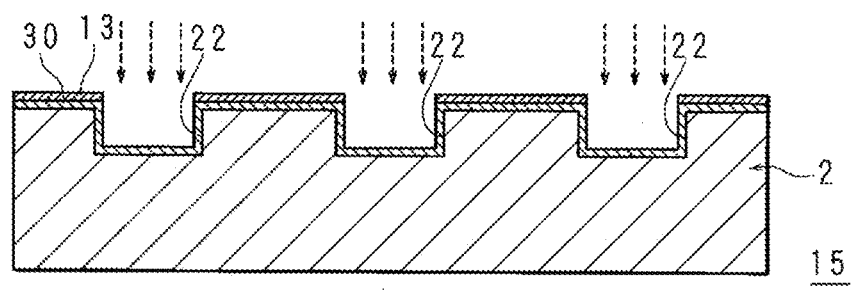
FIG. 11E is a schematic sectional view for explaining the electronic-component manufacturing method.

The mask 13 is irradiated with a femtosecond laser beam or a picosecond laser beam to perforate it with areas corresponding to the interconnect pattern (S29, FIG. 11E). Perforating of the mask may be carried out by means of a UV laser, a YAG laser, a $CO_2$ laser, or an excimer laser.

Figure 11F:
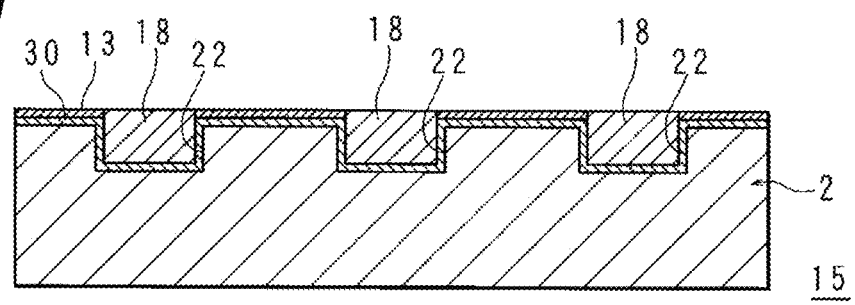
FIG. 11F is a schematic sectional view for explaining the electronic-component manufacturing method.

Electrolytic Cu plating is carried out to form the second Cu metallization portions 18 on the areas of the metallizing film 30 corresponding to the interconnects (S30, FIG. 11F). The electrolytic Cu-plating solution composition and plating conditions are the same as the electrolytic Cu-plating solution composition and plating conditions of Embodying Mode 1.

Since the metallizing film 30 is formed on the entire surface of the base layer 2, in a state in which the interconnect plane is electrically connected during power feed, electrolytic Cu plating can be carried out to form the second Cu metallization 18 on the wiring arrangement where the mask 13 is not present on its surface. The second Cu metallization 18 is provided so as to protrude from the surface of the base layer 2 in a rectangular form or a trapezoidal form when viewed sideways.

Figure 11G:
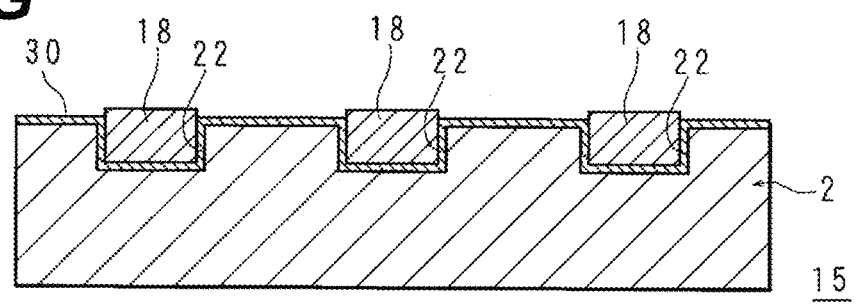
FIG. 11G is a schematic sectional view for explaining the electronic-component manufacturing method.

An alkaline solution is employed to exfoliate the mask 13 (S31, FIG. 11G).

Figure 11H:
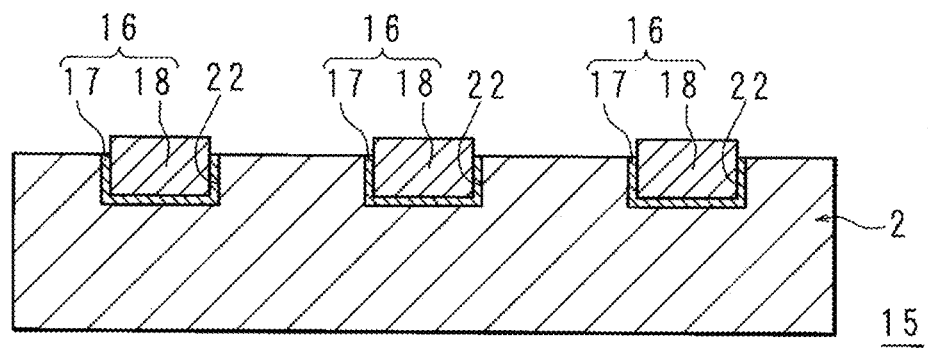
FIG. 11H is a schematic sectional view for explaining the electronic-component manufacturing method.

The exposed metallizing film 30 is removed by etching (S32, FIG. 11H). For the etching solution, a fluid that can dissolve Cu is employed. The thickness of the metallizing film 30 is on the order of 0.1 μm to 1 μm, and the amount whereby the second Cu metallization portions 18 protrude from the surface is, for example, several dozen μm, wherein the orders of magnitude differ. The electronic component 15 is immersed in the etching solution for a period of time that is such that while the metallizing film 30 is removed by the etching, the thickness of the second Cu metallization portions 18 does not diminish.

The surface is dried (S33). Drying is carried out at a temperature of 20° C. to 80° C., for example.

As given above, interconnects 16 including first Cu metallization portions 17 and second Cu metallization portions 18 are formed.

According to the present embodying mode, onto a base layer 2 composed of a difficult-to-metallize material, metallization having favorable adhesion can be easily carried out, with no employing of any special chemical solution or photolithographic technique.

In Embodying Mode 1, since, as indicated in FIG. 3D, the interconnect plane is not electrically connected, a power-feed plane is required in order for the electrolytic Cu plating to be carried out.

In the present embodying mode, since as described above the metallizing film 30 is formed on the entire surface of the base layer 2, with no providing of a power-feed plane, electrolytic Cu plating can be carried out to form the second Cu metallization portions 18. Since a power-feed plane for connecting the interconnect plane is not necessary, the number of operational steps can be reduced.

In the present embodying mode, since the mask 13 is utilized to carry out Cu metallization only on the roughened areas of the base layer 2, the interconnect 16 patterning precision is excellent, and surface polishing is unnecessary. In a state in which the areas apart from the areas corresponding to the interconnect pattern is protected by the mask 13, the interconnect pattern forms readily. The degree of freedom for the thickness of the second Cu metallization portions 18 that form is also high.

In the following, an evaluation test and cross-sectional observation of a test baseplate manufactured according to the manufacturing method of the present embodying mode will be described.

Evaluation Test and Cross-Sectional Observation

Cu foil was provided according to the manufacturing method of Embodying Mode 1 on a substrate composed of an acrylic resin, PET, PTFE, a thin-glass sheet, an epoxy resin, or a liquid-crystal polymer, utilizing in the manner above-described a femtosecond green laser, and a peel (copper foil tear-strip) test was conducted to determine the peel strength.

The peel test was carried out by adhering a substrate metallized to provide it with copper foil onto a test baseplate with double-sided tape, and tear-stripping the copper foil 90° upward while sliding the test baseplate longitudinally.

The test conditions are as follows.

| Testing device | tension-compression tester ("EZ Test" manufactured by Shimadzu Corporation) |
|---|---|
| Peel speed | 50 mm/min |
| Peel direction | 90° |
| Peel length | 30 mm |
| Copper foil dimensions | width 5 mm × length 90 mm |
| Peel speed | 54 mm/min |

Figure 12:
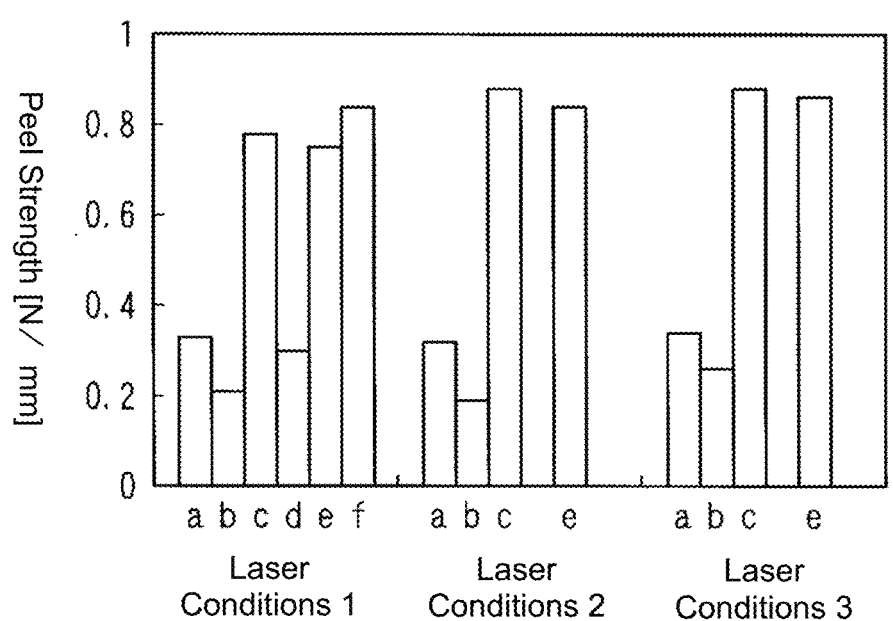
FIG. 12 is a graph indicating peel strength of substrates composed from acrylic resins, polyethylene terephthalate (PET), polytetrafluoroethylene (PTFE), thin-glass sheets, epoxy resins, as well as liquid-crystal polymers.

The results are presented in Table 1 below and in FIG. 12. Along the horizontal axis in FIG. 12, a is an acrylic resin, b is PET, c is PTFE, d is a thin-glass sheet, e is an epoxy resin, and f is a liquid crystal polymer. The vertical axis in FIG. 12 is the peel strength (N/mm).

TABLE 1

| | Peel Strength [N/mm] | | | |
|---|---|---|---|---|
| Material | Laser Conditions 1 | Laser Conditions 2 | Laser Conditions 3 | Notes |
| Acrylic resin | 0.33 | 0.32 | 0.34 | 80° C.; 30 min. |
| Acrylic resin (no baking) | 0.10 | | | |
| PET | 0.21 | 0.19 | 0.26 | |
| PTFE | 0.78 | 0.88 | 0.88 | 200° C.; 30 min. |
| Thin-glass sheet | 0.3 | | | 200° C.; 30 min. |
| Epoxy resin | 0.75 | 0.84 | 0.86 | 80° C.; 30 min. |
| Liquid-crystal polymer | 0.84 | | | 200° C.; 30 min. |

The laser conditions 1, 2, 3 for the femtosecond green laser are set forth in Table 2 to Table 4 below. In Table 2, "repetition frequency" is pulses/sec.

TABLE 2

| Laser Conditions 1 | | |
|---|---|---|
| | Thin-Glass Sheet | Other |
| Output power [W] | 0.25 | 0.3 |
| Repetition frequency [kHz] | 100 | |
| Velocity [mm/sec] | 200 | 400 |
| Pitch [μm] | 2 | 4 |
| Scanning method | Horizontal | |
| Scanning pitch [μm] | 5 | |

TABLE 3

| Laser Conditions 2 | | |
|---|---|---|
| | Thin-Glass Sheet | Other |
| Output power [W] | 0.25 | 0.3 |
| Repetition frequency [kHz] | 100 | |
| Velocity [mm/sec] | 200 | 400 |
| Pitch [μm] | 2 | 4 |
| Scanning method | Vertical/Horizontal | |
| Scanning pitch [μm] | 10 | |

TABLE 4

| Laser Conditions 3 | | |
|---|---|---|
| | Thin-Glass Sheet | Other |
| Output power [W] | 0.25 | 0.3 |
| Repetition frequency [kHz] | 100 | |
| Velocity [mm/sec] | 200 | 400 |
| Pitch [μm] | 2 | 4 |
| Scanning method | On 45° bias | |
| Scanning pitch [μm] | 10 | |

From Table 1 and FIG. 12, it will be understood that high peel strengths of 0.2 to 0.26 N/mm on PET, 0.1 to 0.34 N/mm on acrylic resin, 0.3 N/mm on thin-glass sheet, and 0.75 to 0.88 N/mm on PTFE, epoxy resin, and liquid-crystal polymer were obtained, with the adhesion being favorable. The peel strength is preferably at least 0.1 N/mm. In the case of acrylic resins, it is at least 0.2 N/mm, and at least 0.3 N/mm, in order of further preferability. In the case of PET, it is more preferably at least 0.2 N/mm. In the case of thin-glass sheet, it is more preferably at least 0.3 N/mm. In the case of PTFE, epoxy resins, and liquid-crystal polymers, it is at least 0.7 N/mm, and at least 0.8 N/mm, in order of further preferability.

Figure 13:
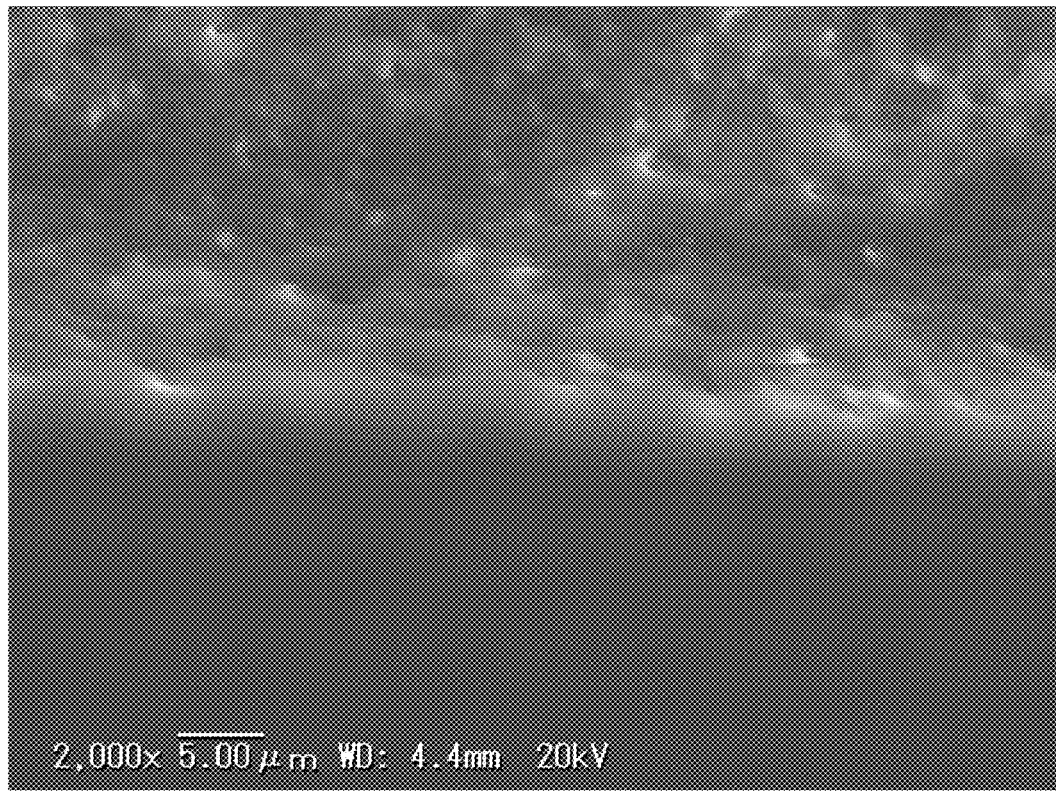
FIG. 13 is an SEM micrograph showing a process-worked section of an acrylic-resin substrate when having been irradiated with a femtosecond green laser beam.
Figure 14:
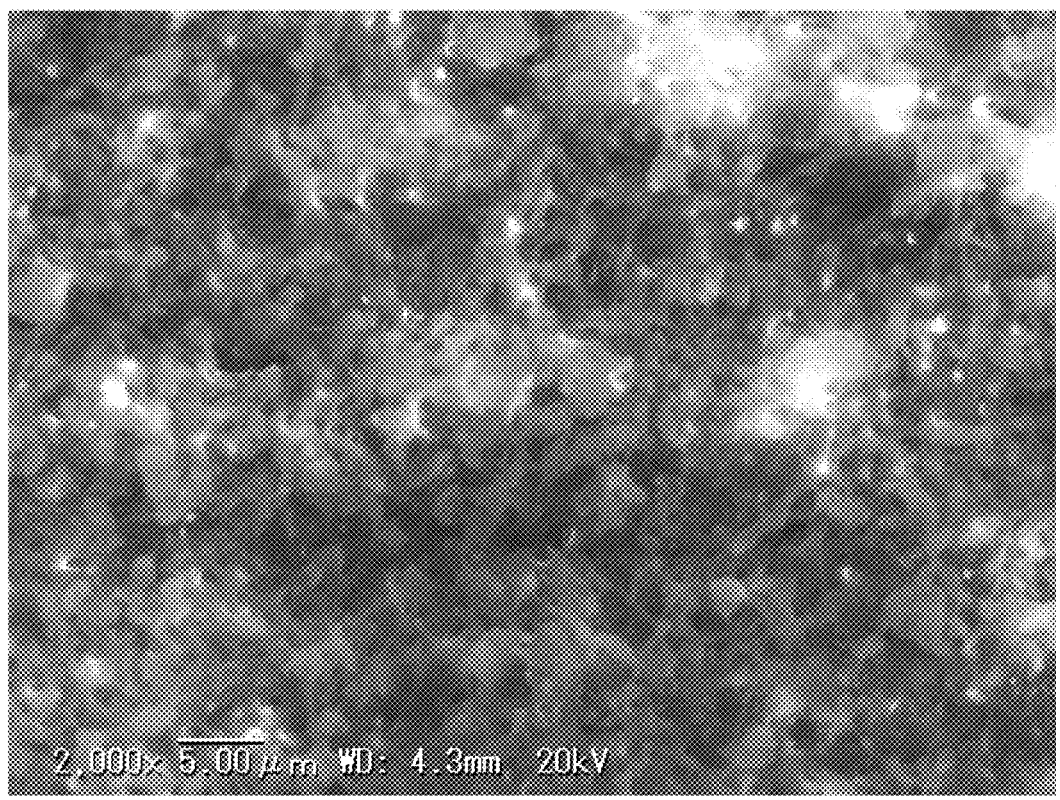
FIG. 14 is an SEM micrograph showing a boundary between process-worked and unworked sections.

FIG. 13 is an SEM micrograph showing a process-worked section of an acrylic-resin substrate when having been irradiated with a femtosecond green laser beam, and FIG. 14 is an SEM micrograph showing a boundary between process-worked and unworked sections thereof.

From FIGS. 13 and 14, it will be appreciated that the surface of the acrylic-resin substrate is roughened.

Figure 15:
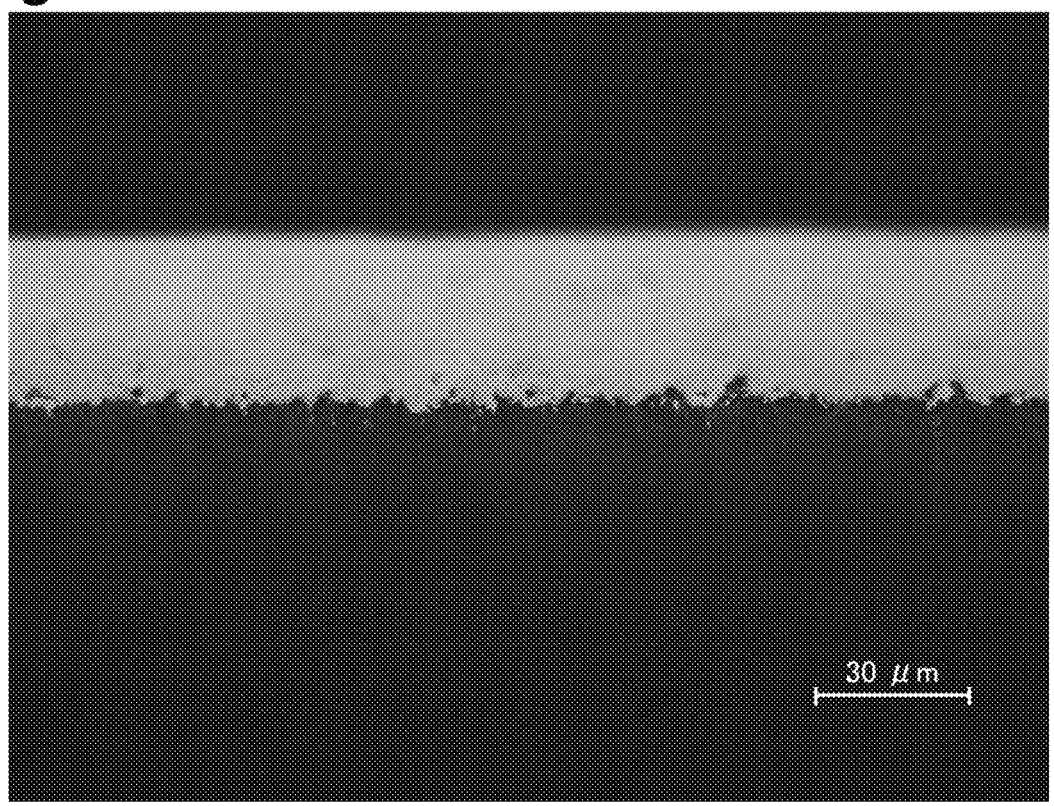
FIG. 15 is an SEM micrograph showing a cross-section through a substrate made of an acrylic resin, when having been irradiated with a femtosecond green laser beam and provided with Cu plating.
Figure 16:
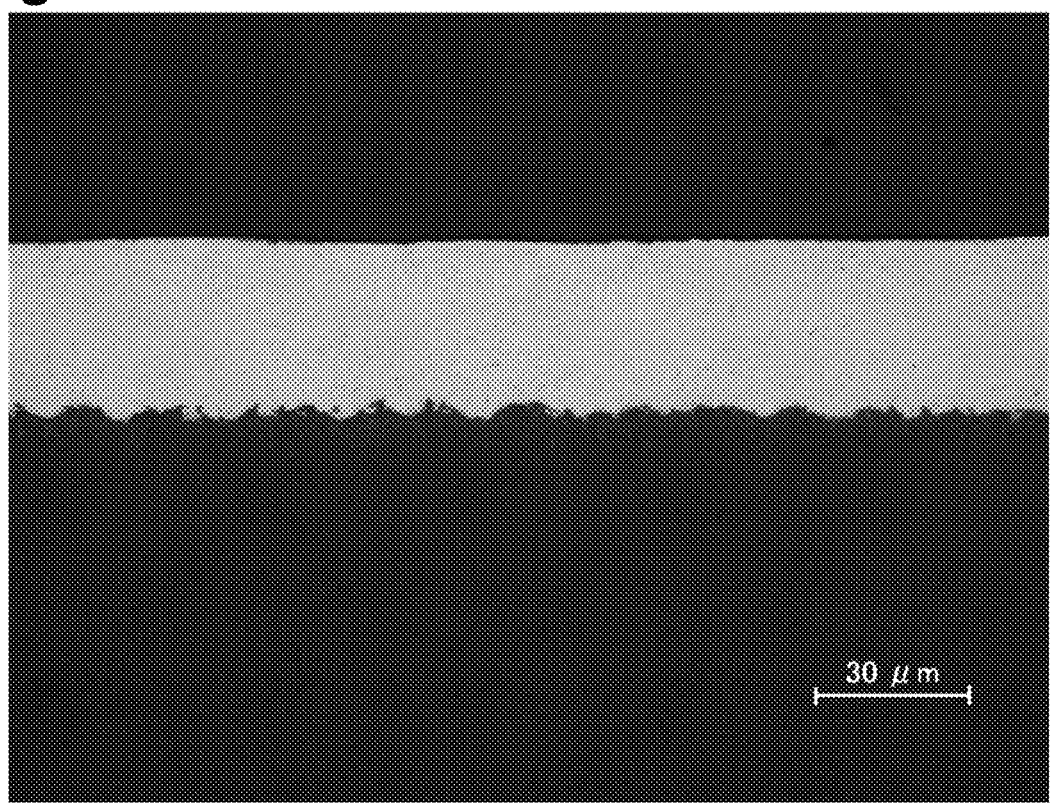
FIG. 16 is an SEM micrograph showing a cross-section through a substrate made of PET resin, when having been irradiated with a femtosecond green laser beam and provided with Cu plating.
Figure 17:
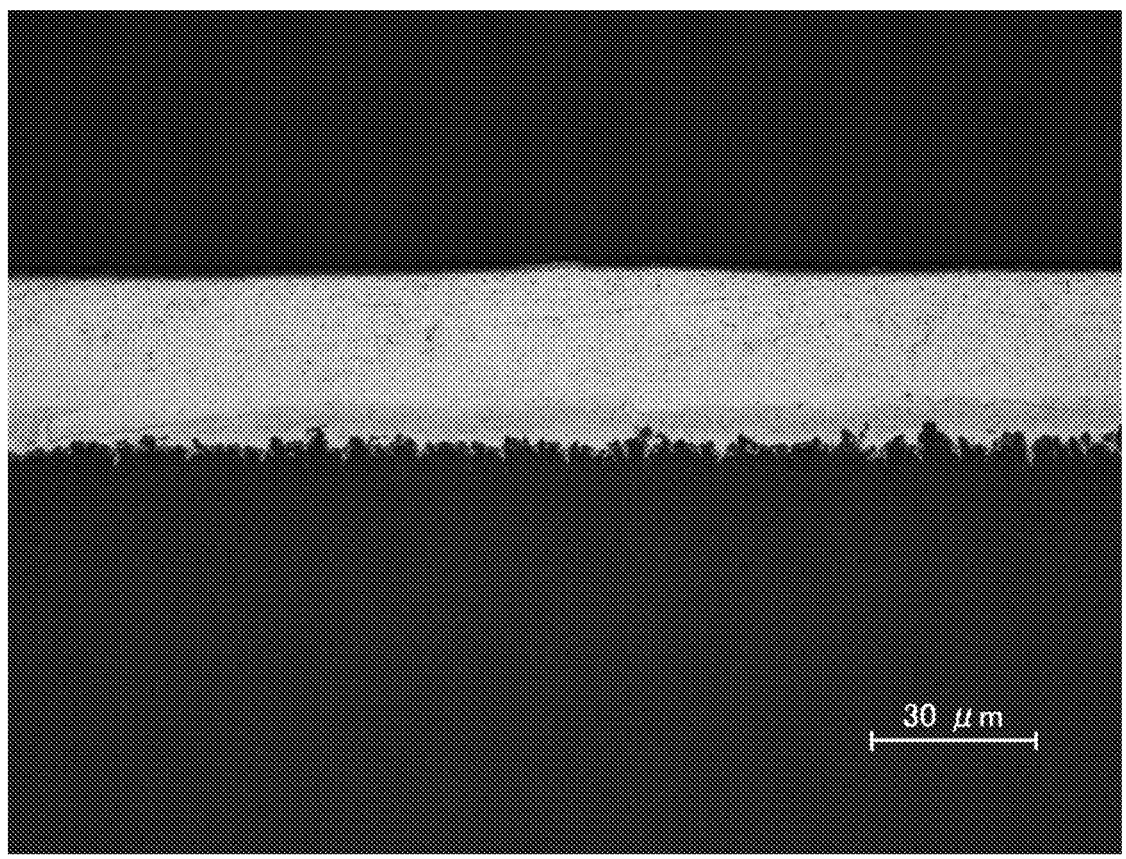
FIG. 17 is an SEM micrograph showing a cross-section through a substrate made of PTFE resin, when having been irradiated with a femtosecond green laser beam and provided with Cu plating.

FIG. 15 is an SEM micrograph showing a cross-section through a substrate made of an acrylic resin, when having been irradiated with a femtosecond green laser beam and provided with Cu metallization. FIG. 16 is an SEM micrograph showing a cross-section through a substrate made of PET, when having been irradiated with a femtosecond green laser beam and provided with Cu metallization. FIG. 17 is an SEM micrograph showing a cross-section through a substrate made of PTFE, when having been irradiated with a femtosecond green laser beam and provided with Cu metallization.

It will be appreciated that in any of the cases, there is minute roughness between the substrate and the Cu metallization layer, and that they are firmly joined by a mechanical interlocking effect.

Table 5 below presents the arithmetic mean roughnesses Ra (μm) and the maximum height roughnesses Rz (μm) as surface roughnesses found when substrates of each of the substances were irradiated with a femtosecond green laser beam according to Laser Conditions 1.

TABLE 5

| | Surface Roughness | | | |
|---|---|---|---|---|
| | Unprocessed Section | | Laser-Processed Section | |
| Material | Ra [μm] | Rz [μm] | Ra [μm] | Rz [μm] |
| Acrylic resin | 0.0028 | 1.7330 | 0.7300 | 5.4340 |
| PET | 0.0066 | 1.4300 | 1.0940 | 7.9830 |
| PTFE | 0.1790 | 3.4250 | 0.7590 | 7.3950 |
| Thin-glass sheet | 0.0960 | 1.6080 | 0.5670 | 7.8410 |
| Epoxy resin | 0.0830 | 2.0550 | 0.3090 | 8.5990 |
| Liquid-crystal polymer | 0.1100 | 2.3060 | 0.6470 | 7.4400 |

Measured with laser microscope

From Table 5, the fact will be understood that with substrates of whichever of the substances, the surface roughness grew larger remarkably in the laser-processed part compared with the unprocessed part.

Next, the relationship between surface roughness and Cu-foil adhesion was investigated when an acrylic resin was used as the substrate, its surface roughness was varied by irradiation with a femtosecond green laser beam, and it was provided with Cu foil according to the manufacturing method of Embodying Mode 1. The results are presented in Table 6 below. The adhesion evaluation was carried out in accordance with the tape test of the JIS H8504 15.1 plating-adhesion testing method. In this tape test, a testing tape (adhesive tape prescribed by JIS Z 1522) strip is stuck onto the plating surface, leaving a 30-50 mm section that is not stuck on, the remaining section of the tape strip is grasped and forcefully pulled taught so as to be perpendicular to the plating surface, and the tape strip is instantaneously torn away. If there is plating adherence on the adhesive surface of the peeled-away tape strip, the plating is deemed adhesion-poor. When the tested site is visually observed and peeling off or swelling of the plating is obvious, it is deemed adhesion-poor.

TABLE 6

| | Surface Roughness | | Laser | Tape Test | |
|---|---|---|---|---|---|
| Material | Ra [μm] | Rz [μm] | Conditions | Result | Notes |
| PTFE | 0.179 | 3.425 | Unprocessed | Peeling | Unprocessed section |
| | 0.187 | 1.004 | Laser Conditions 4 | Peeling | |
| | 0.206 | 2.004 | Laser Conditions 5 | No peeling | |
| | 0.759 | 7.395 | Laser Conditions 1 | No peeling | |

The laser conditions 4 and 5 for the femtosecond green laser are set forth in Table 7 below.

TABLE 7

| Laser Conditions | Laser Conditions 4 | Laser Conditions 5 |
|---|---|---|
| Material | PTFE | |
| Output power [W] | 0.2 | 0.25 |
| Repetition frequency [kHz] | 100 | |
| Velocity [mm/sec] | 400 | |
| Pitch [μm] | 4 | |
| Scanning method | Horizontal | |
| Scanning pitch [μm] | 5 | |

From Table 6, it will be appreciated that when the arithmetic mean roughness Ra (μm) is 0.2 μm or more, the adhesion of the Cu metallization is favorable. The arithmetic mean roughness Ra (μm) in order of further preferability is 0.3 μm or more, 0.4 μm or more, and 0.5 μm or more.

From Table 6, it will be appreciated that when the maximum height roughness Rz (μm) is 2 μm or more, the adhesion of the Cu metallization is favorable. The maximum height roughness Rz (μm) in order of further preferability is 3 μm or more, 4 μm or more, and 5 μm or more.

As given above, according to the electronic-component manufacturing method of the present embodying mode, roughness of minute and sharp, multi-angled pyramidal form is created in the surface of a base layer, and it was confirmed that thanks to a mechanical interlocking effect, adhesion of the metallization to the layer being metallized is favorable even in cases where the layer being metallized does not readily admit of chemical bonding between itself and the metallization layer, or is composed of a difficult-to-metallize material that does not readily admit of the roughing of its surface.

The peel strength of an electronic component obtained according to the manufacturing method of the present embodying mode is 0.1 N/mm or more.

The embodying modes disclosed on the present occasion should in all respects be considered to be illustrative and not limiting. The scope of the present invention is not the above-described meanings, but is intended to include meanings equivalent to the scope of the claims and all modifications within the scope.

For example, the electronic components are not limited to printed wiring boards. The plating too is not limited to instances where the wiring arrangement are made. The type of plating too is not limited to Cu plating, and Ni or like plating can be carried out.

The femtosecond laser irradiating conditions too are not limited to the explained instances in the embodying modes.

LEGEND 1, 11, 15: electronic component
2: base layer
20, 21, 22: recesses
3, 17: first Cu metallization
30: metallizing film
4, 18: second Cu metallization
5, 12, 16: interconnects
13: mask
14: SnPd catalyst

What is claimed is:

1. A method of manufacturing an electronic component in which interconnects are formed on a front surface of a substrate, the electronic-component manufacturing method comprising:
   a first step of shining either a picosecond laser beam in which the pulse-width units are picoseconds, or a femtosecond laser beam in which they are femtoseconds, on the front surface of the substrate to form an interconnect pattern, applying a catalyst on the front surface of the interconnect pattern on the substrate and thereafter immersing the substrate in a hydrochloric acid solution, forming a electroless copper metallization layer on the front surface of the substrate, and forming a mask onto the electroless copper metallization layer on the front surface of the substrate;
   a second step of shining the laser beam superficially on the mask where it corresponds to the interconnect pattern to perforate the mask and form patterned interconnects on the substrate;
   a third step of forming on the patterned interconnects a electroplated copper metallization layer in a configuration of squares;
   a fourth step of exfoliating the mask; and
   a fifth step of removing the electroless copper metallization layer where it has been exposed by the exfoliating of the mask; wherein
   the substrate is of a material being any of an acrylic resin, PET, PTFE, glass, an epoxy resin, a liquid-crystal polymer, or a polyimide resin; and
   the catalyst is an Sn—Pd catalyst.

2. The electronic-component manufacturing method set forth in claim 1, wherein in said first step:
   the femtosecond laser beam is of 500 nm to 530 nm wavelength, and the femtosecond laser beam has a pulse width of 1 femtosecond to 1000 femtoseconds; and
   the picosecond laser beam is of 500 nm to 530 nm wavelength, and the picosecond laser beam has a pulse width of 1 picosecond to 10 picoseconds.

3. The electronic-component manufacturing method set forth in claim 1, wherein in said first step, the picosecond laser beam or the femtosecond laser beam is shone on the front surface of the substrate to roughen the front surface to an arithmetic mean roughness Ra of not less than 0.2 μm.

4. The electronic-component manufacturing method set forth in claim 1, wherein said first step forms the electroless copper metallization layer by utilizing an alkaline plating solution, with formalin being the reducing agent.

5. The electronic-component manufacturing method set forth in claim 1, wherein the mask in said first step contains an alkaline-solution soluble acrylic polymer.

6. The electronic-component manufacturing method set forth in claim 1, wherein the mask includes a colorant, a dye, or a pigment.

7. The electronic-component manufacturing method set forth in claim 1, wherein in said second step patterning of the interconnect pattern is carried out based on marks formed on the substrate or the mask.

* * * * *